(12) United States Patent
Worschech et al.

(10) Patent No.: US 8,729,453 B2
(45) Date of Patent: May 20, 2014

(54) SENSOR FOR ELECTROMAGNETIC QUANTITIES AND METHOD FOR MEASURING ELECTROMAGNETIC QUANTITIES

(75) Inventors: Lukas Worschech, Dettelbach (DE); Alfred Forchel, Würzburg (DE); Luca Gammaitoni, Perugia (IT)

(73) Assignee: Julius-Maximilians-Universitat Wurzburg

( * ) Notice: Subject to any disclaimer, the term of this patent is extended or adjusted under 35 U.S.C. 154(b) by 846 days.

(21) Appl. No.: 12/868,685

(22) Filed: Aug. 25, 2010

(65) Prior Publication Data
US 2011/0068853 A1 Mar. 24, 2011

Related U.S. Application Data

(63) Continuation of application No. PCT/EP2009/052324, filed on Feb. 26, 2009.

(30) Foreign Application Priority Data

Feb. 26, 2008 (EP) .................................... 08003512

(51) Int. Cl.
*H01L 31/00* (2006.01)
(52) U.S. Cl.
USPC ...................................................... 250/214.1
(58) Field of Classification Search
USPC ................... 250/214.1, 214 R; 323/253–255; 336/200, 232; 33/361
See application file for complete search history.

(56) References Cited

U.S. PATENT DOCUMENTS

| 6,404,192 B1 | 6/2002 | Chiesi et al. |
| 7,009,392 B2 | 3/2006 | Robinson et al. |
| 7,388,200 B2 * | 6/2008 | Stewart et al. ................ 250/306 |
| 2004/0183531 A1 | 9/2004 | Robinson et al. |

FOREIGN PATENT DOCUMENTS

| EP | 0 461 867 A2 | 12/1991 |
| WO | WO 02/19436 A1 | 3/2002 |

OTHER PUBLICATIONS

International Preliminary Report on Patentability and Written Opinion of the International Searching Authority for International Application No. PCT/EP2009/052324 dated Aug. 31, 2010.
Snare, Robert C., "A History of Vector Magnetometry in Space," Measurement Techniques in Space Plasmas: Fields Geophysical Monograph 103, American Geophysical Union, 1998, pp. 101-114.
Internet web page printout of internet access: http://en.wikipedia.org/wiki/Resonant_tunnelling_diode, "Resonant tunneing diode," 3 pages, available prior to Feb. 26, 2008.

(Continued)

*Primary Examiner* — Seung C Sohn
(74) *Attorney, Agent, or Firm* — Marshall, Gerstein & Borun LLP

(57) ABSTRACT

A sensor for electromagnetic quantities includes a bistable device whose residence times in the stable states depend on the electromagnetic quantity. The bistable device further includes a switching zone, whose dimension in the direction of a current of charge carriers is smaller than the ballistic mean free path of the charge carriers within the switching zone. An analyzer circuit may be used for generating a sensor output signal depending on the residence times of the bistable device for measuring the electromagnetic quantity. The switching device may be a resonant tunneling diode or a Y-branch nanojunction.

16 Claims, 10 Drawing Sheets

(56) References Cited

OTHER PUBLICATIONS

Gammaitoni, L. et al., "Noise Activated Nonlinear Dynamic Sensors," Phys. Rev. Lett., The American Physical Society, vol. 88, No. 23, pp. 230601-1 to 230601-4 (Jun. 10, 2002).

Palm, T., "Self-consistent calculations of an electron-wave Y-branch switch," J. Appl. Phys. 74(5), pp. 3551-3557 (Sep. 1, 1993).

Wesström, Jan-Olof J. "Self-Gating Effect in the Electron Y-Branch Switch," Phys. Rev. Lett., The American Physical Society, vol. 82, No. 12, pp. 2564-2567 (Mar. 22, 1999).

Reitzenstein, S. et al., "Capacitive Coupling Enhanced Switching Gain in an Electron Y-Branch Switch," Phys. Rev. Lett., The American Physical Society, vol. 89, No. 22, pp. 226804-1 to 226804-4 (Nov. 25, 2002).

Bandaru, P.R., et al., "Novel electrical switching behavior and logic in carbon nanotube Y-junctions," Nature Materials, vol. 4, pp. 663-666 (Sep. 1, 2005).

Worschech L., et al., "Topical Review; Nonlinear properties of ballistic nanoelectronic devices," Journal of Physics: Condensed matter, Institute of Physics publishing, Bristol, GB, vol. 17, No. 29, pp. R775-R802, XP020089282, ISSN: 0953-8984 (Jul. 27, 2005).

Dennis Huo et al., "A ballistic nanoelectronic device simulator," Nanoscale Architectures, 2007, Nanosearch 2007. IEEE International Symposium on, IEEE, PI, pp. 38-45, XP031189155, ISBN: 978-1-4244-1790-2 (Oct. 1, 2007).

International Search Report for International Application No. PCT/EP2009/052324 mailed May 25, 2009.

\* cited by examiner 200 nm Si doped
15 nm undoped       GaAs 3 nm    AlGaAs
4 nm    GaAs
3 nm    AlGaAs 15 nm undoped       GaAs
200 nm Si doped 200 nm Si doped
10 nm undoped    InAs 2 nm    AlSb
8 nm    GaSb
2 nm    AlSb 10 nm undoped    InAs
200 nm Si doped 200 nm Si doped
10 nm undoped    InAs 2 nm    AlSb
8 nm    InAs
2 nm    AlSb 10 nm undoped    InAs
200 nm Si doped InP substrate
200 nm Si doped
10 nm undoped
In content ~52%    InGaAs 2 nm    AlAs
2 nm    InGaAs
5 nm    InAs
2 nm    InGaAs
2 nm    AlAs 10 nm undoped    InGaAs
200 nm Si doped

SENSOR FOR ELECTROMAGNETIC QUANTITIES AND METHOD FOR MEASURING ELECTROMAGNETIC QUANTITIES

CROSS-REFERENCE TO RELATED APPLICATIONS

This is a continuation application which is based on and claims priority to International Application Number PCT/EP 2009/052324, entitled "Sensor For Electromagnetic Quantities And Method For Measuring Electromagnetic Quantities," which was filed on Feb. 26, 2009 and designated the United States, which is a PCT application claiming priority to European Patent Application Number 08 003 512.4, filed on Feb. 26, 2008, the entire disclosure of each of which is hereby expressly incorporated by reference herein.

FIELD OF THE TECHNOLOGY

The disclosure relates to a sensor for electromagnetic quantities that includes a bistable device whose residence times in the stable states depend on the strength of the electromagnetic quantities, and an analyzer circuit arranged for generating a sensor output signal dependent on the residence times of the bistable device. The disclosure further relates to a method for measuring electromagnetic quantities.

BACKGROUND

A sensor and a method are known from U.S. Pat. No. 7,009,392 B2. This document discloses a method for operating a flux gate sensor. According to the known method, the flux gate sensor is biased with a periodic bias signal in the form of a superposition of a square wave and a triangular wave. The change in residence time statistics in the stable state of the sensor is analyzed for estimating constant or low frequency target signals to be detected by the flux gate sensor.

A similar method can also be found in GAMMAITONI, L., BULSARA, A., Noise Activated Nonlinear Dynamic Sensors, Phys. Rev. Lett. 88, 230601 (2002).

PALM, T., Self-consistent calculations of an electron-wave Y-branch switch, J. Appl. Phys. 74, 3551 (1993) describes the basic principles of a Y-branch nanojunction.

WESSTRÖM, Jan-Olof J., Self-Gating Effect in the Electron Y-Branch Switch, Phys. Rev. Lett. 82, 2564-2567 (1999) demonstrates the dynamical bistable behavior under the action of external control fields.

REITZENSTEIN, S., WORSCHECH, L., HARTMANN, D., KAMP, M., FORCHEL, A., Capacitive Coupling Enhanced Switching Gain in an Electron Y-Branch Switch, Phys. Rev. Lett. 89, 226804-1 (2002) contain further details with respect to the switching behavior of Y-branch nanojunction. Further details can also be found in BANDARU, P. R., DARAIO, C., JUN, S., RAO, A. M., Novel electrical switching behavior and logic in carbon nanotube Y-junctions, Nature Materials 4, pp. 663-666 (1 Sep. 2005) Letters.

SUMMARY

According to a first aspect there is provided a bistable device, which is a switching device having a switching zone, whose dimension in the direction of a current of charge carriers is smaller than the ballistic mean free path of the charge carriers within the switching zone.

A switching device is defined as a conducting device that is able to change its state of conductance for modifying a current flowing though the switching device. The switching zone is a region within the switching device whose transmission of charge carriers can be changed for switching purposes. The mean free path of the charge carriers corresponds to the product of the Fermi velocity of the charge carriers at the Fermi surface with the mean scattering time of the charge carriers between scattering events. If the mean free path of the charge carriers is greater than the dimension of the current in the direction of the current within the range of temperatures in which the sensor is operated, the switching time of the switching device is minimized so that a large number of measurement cycles can be performed resulting in an enhanced accuracy of the sensor. For typical operational temperature in the range between 70° K and 450° K, the dimensions of the switching zone should typically range between 1 nm and 1000 nm, in particular between 5 nm and 100 nm.

According to a second aspect, the bistable device is connected to a bias signal generator for driving the switching process. The bias signal further causes the bistable device to operate in a bistable mode.

According to a third aspect, the bias signal is oscillating and the sensor output signal is integrated over a plurality of cycles. The integration may be performed by a low pass filter arrangement resulting in an efficient measuring device that can be produced at low costs.

According to a fourth aspect, for realizing the sensor, a three-terminal nanojunction having at least a source, a gate and a drain may be used as switching device.

According to a fifth aspect, a Y-branch nanojunction can be used for the switching device. In this case, the switching zone is a forking region of the Y-branch nanojunction. Y-branch nanojunction can be produced in a relatively easy way.

According to a sixth aspect, if a Y-branch nanojunction is used as a switching device, the bias voltages are applied between the stem functioning as the source and a branch functioning as the gate and are further applied between the stem and the other branch functioning as the drain. The output signal then depends on the current through source and drain.

According to a seventh aspect, the switching device may also include a switching zone having a current-voltage-characteristic with an intermediate region of negative differential resistance. The switching zone may be connected in series with a resistance. If the resistance and a voltage over the resistance and the switching zone are chosen appropriately, load lines can cross the current-voltage-characteristic within the region of negative differential resistance resulting in a bistable switching behavior of the switching zone.

According to an eighth aspect, the switching zone having a current-voltage-characteristic with a region of negative differential resistance can be a device with a resonance tunneling structure comprising at least one potential well confined within two adjacent potential barriers. Such devices can be produced with standard lithographic techniques and layer-growth proc-esses such as Molecular Beam Epitaxy (=MBE).

According to a ninth aspect, a nanojunction having three terminals is formed if the sensor comprises a layer sequence on a substrate and if the layer sequence is separated into two adjacent branches by a trench. For keeping the switching zone as small as possible the trench extends through the switching zone. Accordingly, only one of the switching zones within one of the branches is used as an active switching zone performing switching operations.

According to a tenth aspect, for triggering the switching process, the switching device interacts with a sensing arrangement, whose conductance depends on the strength of an electromagnetic quantity. The change in conductance alters the slope of the load line resulting in a shift of the working point of the switching device so that the switching operation of the switching device is triggered.

According to an eleventh aspect, for measuring a magnetic field, the sensing arrangement can be a variation of the roughness of surfaces of the branches resulting in variations in the conductance of the branches dependent on the strength of the magnetic field to be measured.

According to a twelfth aspect, if the electromagnetic quantity to be measured is a photon flux, the sensing arrangement can be formed by material suitable for the absorption of radiation.

According to a thirteenth aspect, phosphides, arsenides or antimonides are suitable materials for the switching device. A switching device based on an antimonide may also be a detector in the 1.8 to 4 µm wavelength range.

BRIEF DESCRIPTION OF THE DRAWINGS

Further advantages and properties are disclosed in the following description, in which exemplary embodiments are explained in detail based on the drawings.

DETAILED DESCRIPTION

Figure 1:
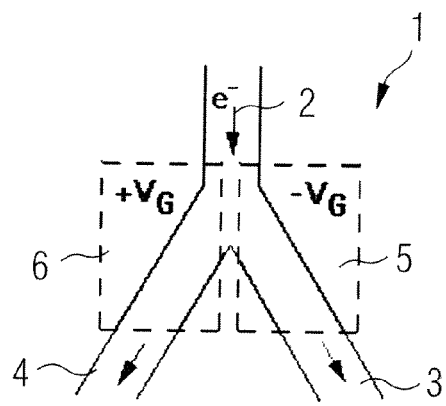
FIG. 1 shows a typical Y-branch nanojunction which can be used for a sensor for measuring electromagnetic quantities.
Figure 2:
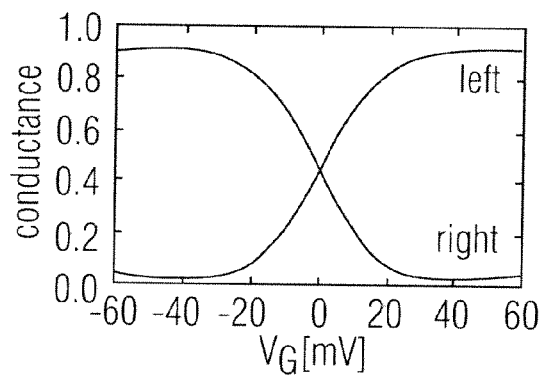
FIG. 2 is a diagram, in which the conductance of the branches of the nanojunction according to FIG. 1 is plotted against a gate voltage.

FIG. 1 shows a typical Y-branch nanojunction 1 with a stem 2, two branches 3 and 4 and two electrodes 5 and 6 associated with the branches 3 and 4 respectively. The Y-branch nanojunction 1 is a nanoscale device that shows dynamical bistable behavior under the action of external control fields. The path the electron goes through depends on a gate voltage $V_G$ applied to the electrodes 5 and 6. FIG. 2 shows a diagram in which the conductance between the stem 2 and the branches 2 and 4 is plotted against a gate voltage $V_G$.

From FIG. 2 it can be recognized that the conductance between the stem 2 and each of the branches 3 and 4 depends on the polarization and amount of the gate voltage $V_G$.

On a nanoscale, the gate voltage $V_G$ can be considered as depending on the path of the electrons. Therefore, depending on which path the electron goes through, a change in the gate voltage $V_G$ is observed as will be explained in more detail referring to FIG. 3.

Figure 3:
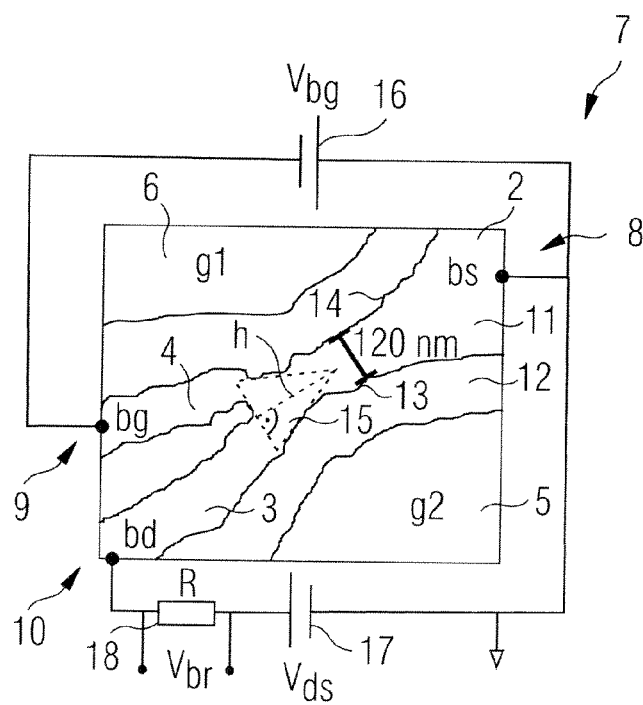
FIG. 3 depicts a sensor arrangement for measuring electromagnetic quantities.

FIG. 3 shows a sensor 7 based on the nanojunction 1. In the sensor arrangement according to FIG. 3, the stem 2 has the function of a source 8 whereas the branches 3 and 4 have the function of a gate 9 and a drain 10 respectively. The nanojunction 1 is formed by a narrow conducting strips 11 made from conducting material deposited on a substrate 12. The conducting strips 11 are delimited by two outer contour lines 13 and 14 extending on the outside from the stem to the branches 3 and 4 and a inner contour line 15 extending along the inside of the branches 3 and 4.

The contour lines 13 to 15 enclose a forking region 15. The forking region 15 is defined by a triangle, whose three sides are fitted to the contour lines 13 to 15. The forking region 15 is the region, in which the electrons are guided into one of the two branches 3 or 4. In the context of this application the dimension of the forking region 15 in the direction of the current shall be the height h of the triangular forking region 15 wherein the side of the forking region 15 touching the inner contour line 15 forms the base line. Typically the forking region extends over a region of the order of $100 \times 100$ nm$^2$.

According to FIG. 3 a voltage source 16 generates a gate voltage $V_{bg}$ that is applied between the source 8 and the branch 4 that has the function of the gate 9. Furthermore another voltage source 17 generates a drain voltage $V_{bd}$ that is applied between the source 8 and the branch 3 that has the function of the drain 10.

The gate voltage $V_{bg}$ can be used to control the nanojunction 1 by directing the electron flux toward the left branch 3 or right branch 4. Thus, a current from the source 8 to the drain 10 measured by a voltage drop $V_{br}$ over a resistor 18 in series with the voltage source 17 varies between two values corresponding to two different electron fluxes.

Figure 4:
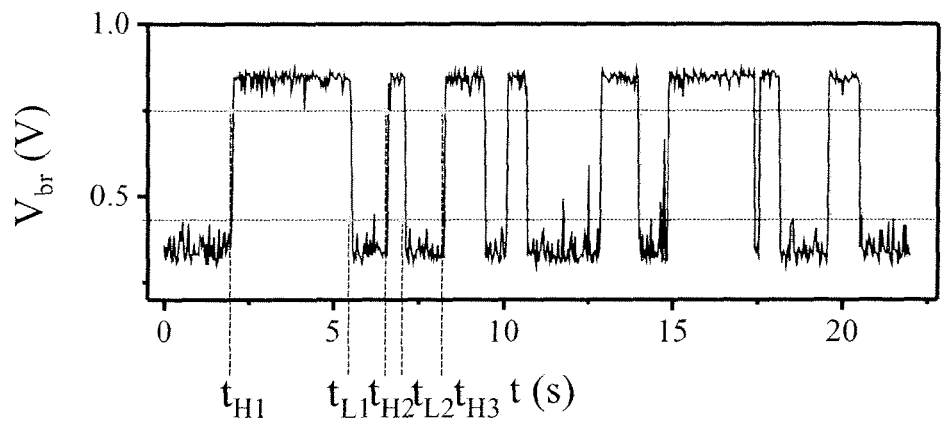
FIG. 4 is a diagram showing the switching of the output voltage of the sensor arrangement of FIG. 3.

For certain values of the gate voltage $V_{bg}$ the voltage $V_{br}$ fluctuates randomly between two values showing a bistable dynamics as depicted in FIG. 4.

The random character of the bistable switching of the nanojunction 1 is attributed to a noise driven process: the output of the nanojunction 1 fluctuates between two distinct values. On properly tuning the control parameters, the nanojunction 1 can be tuned such that the time spent in one state—UP or DOWN in FIG. 4—is on average equal to the time spent in the other state (DOWN or UP).

The bistable switching behavior of the nanojunction 1 can now be used for detecting electromagnetic quantities, in particular electromagnetic fields with high sensitivity. As an example, the functional principle of the nanojunction 1 as a nonlinear magnetic field sensor is explained in the following in more detail.

The magnetic field measurement is based on the following principle: an external magnetic field, applied in a direction perpendicular to the electron momentum, leads to a deflection of the electron path caused by the Lorentz force. Such a behavior can be described by a magnetic field induced asymmetry in the response of the Y-branch nanojunction 1.

By monitoring the effects of this asymmetry on the sensor dynamics, the external magnetic field can be detected and measured, in particular by monitoring the system output residence times. In this context, the residence times are to be understood as the time that the nanojunction 1 spends in each of the two stable states before a transition from one state to the other occurs. Due to the presence of noise the residence time behaves as a random variable whose mean value is the same for both states in the case of a symmetric system.

The presence of an external magnetic signal to be detected and measured is assessed via the monitoring of the difference of the two residence times. In fact, without any external target signal, the residence times will be, on average, identical. The presence of an external target signal usually renders the potential asymmetric with a concomitant difference in the mean residence times which, to first order, is proportional to the asymmetry-producing target signal itself.

Figure 5:
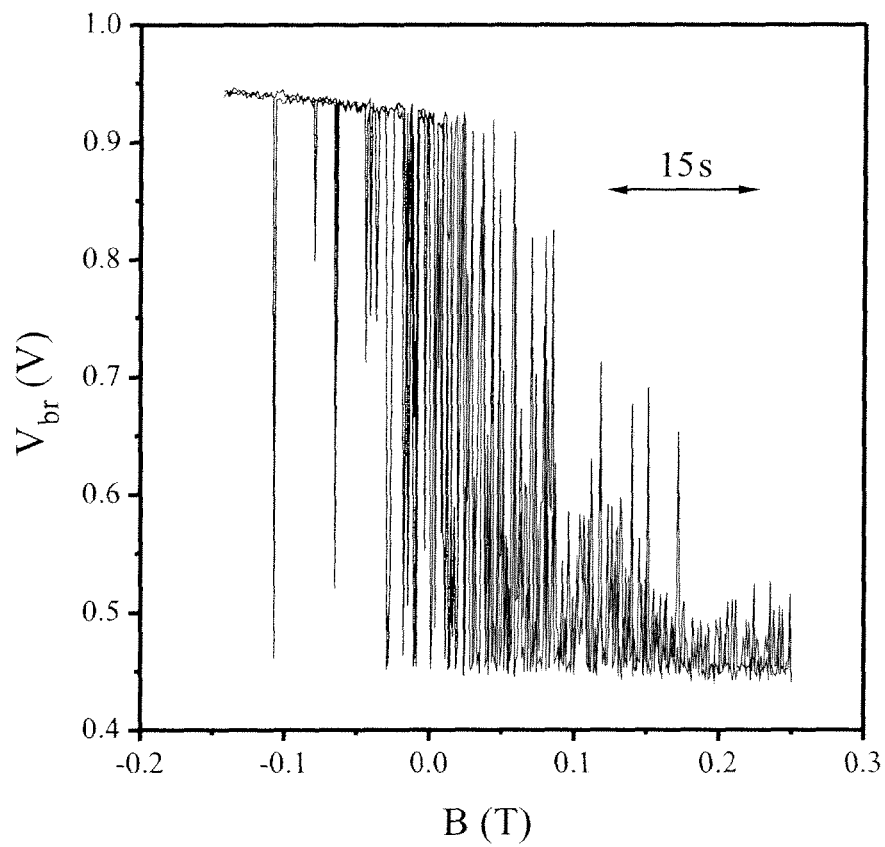
FIG. 5 is a diagram illustrating the bistable behavior of the sensor arrangement of FIG. 3 in dependency of an external magnetic field strength.

In FIG. 5, the output voltage $V_{br}$ of the sensor 7 is shown as a function of the intensity of a DC magnetic field B applied from outside. As it is apparent, the output of the sensor 7 show two states—one around 0.9 (=state UP) the other around 0.35 (=state DOWN). On changing the intensity of the magnetic field B from −0.2 to 0.3, the output of the sensor 7 changes its symmetry moving from a prevalent state UP to a prevalent state DOWN.

The change in symmetry can be monitored in a number of different ways. For example, the residence time difference can be measured as disclosed in U.S. Pat. No. 7,009,392 B. This documents relates to a different device, namely a Flux-Gate magnetometer, but the method disclosed in U.S. Pat. No. 7,009,392 B2 can also be used in conjunction with the devices and the methods described in the present application.

We define the residence time in the UP state as depicted in FIG. 4 as the time interval $T_+$ between the instant of a lower-to-upper state switch and the subsequent instant of the first upper-to-lower switch. Analogously, the residence time in the DOWN state can be defined as the time $T_-$ interval between the instant of an upper-to-lower state switch and the subsequent instant of the first lower-to-upper switch. The switch dynamic being affected by the presence of the noise in the cases of interest, $T_+$ and $T_-$ behave as random variables and the relevant quantities are their mean values known as mean residence times $<T_+>$ and $<T_->$ respectively.

Without any external target signal, in particular when B=0, the residence times will be, on average, identical. Thus, $<T_+>=<T_->$ and $<\Delta T>=|<T_+>-<T_->|=0$. The presence of a magnetic target signal of amplitude B renders the switching asymmetric, with a concomitant difference in the mean residence times: $<\Delta T>=|<T_+>-<T_->|>0$. Due to this feature, it is possible to monitor the difference between the mean residence times of the two states of the system and to use this observable as a quantifier for detecting the presence of the target signal.

Figure 6:
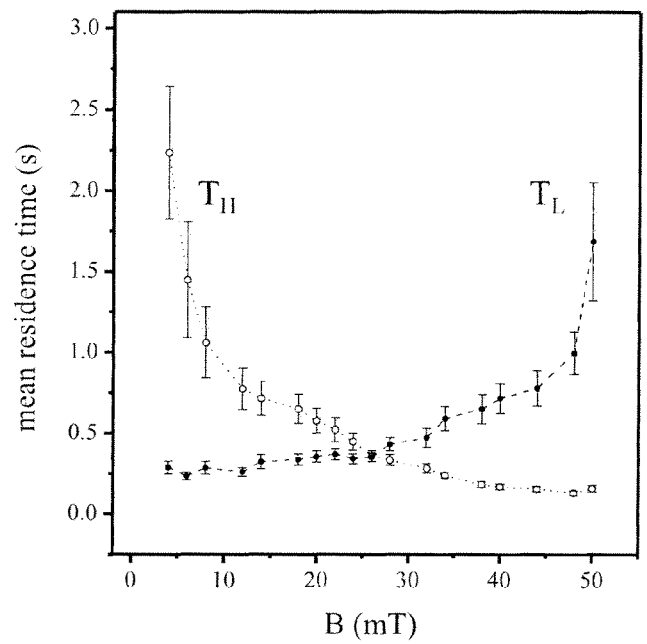
FIG. 6 is a diagram in which the residence times in the stable states are plotted against an external magnetic field strength.

FIG. 6 shows the values of $T_H=<T_+>$ and $T_L=<T_->$ for the nanojunction 1 as a function of the DC magnetic field amplitude B.

It should be noted that the sensor can be properly calibrated such that when $<T_+>=<T_->$ then B=0. In this case, any $<\Delta T>>0$ implies B≠0.

The measurement of the mean residence time difference $<\Delta T>$ in a real bistable device can be a quite troublesome activity. In fact, to obtain the $<\Delta T>$ it is necessary to monitor the switches between the two states by keeping track of the chronology of each switch. Then the single $T_+$ and $T_-$ have to be computed from the switching times and finally, upon accumulation of such quantities, the mean residence times $<T_+>$, $<T_->$ are computed to generate $<\Delta T>$. In general, to incorporate into a micro- or nanosensor all the machinery for computing $<\Delta T>$ can be a difficult task. But such a computation can also be avoided without losing the information on $<\Delta T>$.

To show how this is possible, we consider the functioning of a Schmitt Trigger (=ST) as a mathematical model for the Y-branch nonlinear magnetic field sensor 7 (=Y-MAG).

Figure 7:
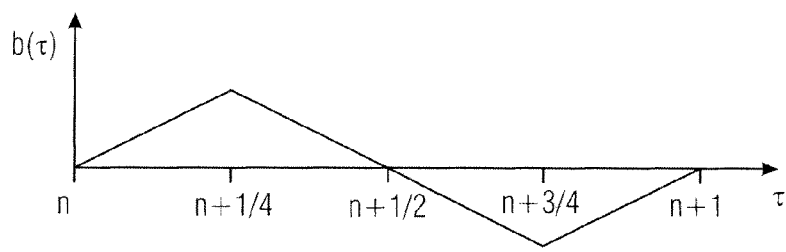
FIG. 7 is a graph of a triangular bias function that can be used for a sensor arrangement such as the sensor arrangement in FIG. 3.

In the following, we will consider an unknown signal (DC) of amplitude ε. To operate the sensor we introduce an auxiliary periodic signal that we will call the bias signal b(τ) (not to be confused with the magnetic field B used above). We consider the following situation: a triangular bias signal b(τ) of amplitude A, with a non-zero target signal ε and null noise:

$$b(\tau) = \begin{cases} 4A(\tau - n) & \text{if} \quad n \leq \tau < n + \frac{1}{4} \\ 2A(1 - 2(\tau - n)) & \text{if} \quad n + \frac{1}{4} \leq \tau < n + \frac{3}{4} \\ 4A(-1 + (\tau - n)) & \text{if} \quad n + \frac{3}{4} \leq \tau < n + 1 \end{cases} \quad (1)$$

with $\tau = t/T_0$, where $T_0$ is the period of the triangular wave and $n = \text{int}(\tau)$ is the integer part of τ. An example of such a bias function is depicted in FIG. 7. With such an input signal, the ST output reads:

$$x(\tau) = \begin{cases} -x_m & \text{if} \quad n \leq \tau < n + \frac{1}{4} \\ +x_m & \text{if} \quad n + \frac{1}{4} \leq \tau < n + \frac{3}{4} \\ -x_m & \text{if} \quad n + \frac{3}{4} \leq \tau < n + 1 \end{cases} \quad (2)$$

with $\tau_+ = t_+/T_0$ and $\tau_- = t_-/T_0$, where $t_+$ is the instant of the first upward crossing of the upper threshold (lower-to-upper state switch) and $t_-$ is the instant of the first downward crossing of the lower threshold (upper-to-lower state switch).

For sake of simplicity we consider the problem of sensing an unknown signal that is constant in time. The DC hidden signal of amplitude c adds to the bias signal b(t). If +b and −b are the two threshold amplitudes of the ST, the relevant crossing times in the absence of noise will be readily computed under the condition $A(t) = b(t) + \epsilon = \pm b$ as:

$$\tau_+ = \frac{b - \varepsilon}{4A} \quad (3)$$

$$\tau_- = \frac{b + \varepsilon}{4A} + \frac{1}{2} \quad (4)$$

As it have been anticipated before, we are interested in computing the mean residence time difference $<\Delta T> = |<T_+> - <T_->|$.

In the absence of noise, clearly $\langle\Delta T\rangle = \Delta T = |T_+ - T_-|$. But $T_+ = t_- - t_+$ and $T_- = T_0 - T_+$, thus:

$$T_+ = T_0(\tau_- + \tau_+) = T_0\left(\frac{A+\varepsilon}{2A}\right) \quad (5)$$

$$T_- = T_0(1 - (\tau_- + \tau_+)) = T_0\left(\frac{A-\varepsilon}{2A}\right) \quad (6)$$

$$\Delta T = |2T_+ - T_0| = |2(t_- + t_+) - T_0| = T_0\frac{\varepsilon}{A} \quad (7)$$

or $$\frac{\Delta T}{T_0} = \frac{\varepsilon}{A} \quad (8)$$

Equation (8) shows that indeed the mean residence time difference carries the information about the hidden signal amplitude c. Most importantly the amplitude of $\Delta T$ is linearly dependent from $\epsilon$. Such a condition is quite desirable for a sensor arrangement as the sensor 7.

In the presence of noise, the deterministic values that we have computed here are still valid provided that two additional conditions are respected: i) the noise intensity is small compared to the threshold: $\sigma \ll b$ and ii) the average value of the relevant quantities is considered.

As we have pointed out before, the direct computation of $\Delta T$ as obtained through the measurement of $t_-$ and $t_+$ is quite troublesome. In order to find a way around this problem we considered the integrated output $I(\tau)$:

$$I(\tau) = \int_0^\tau x(\tau')d\tau' \quad (9)$$

In a single period $T_0$ we have:

$$I(1) = \int_0^1 x(\tau')d\tau' \quad (10)$$
$$= \int_0^{\tau_+} x(\tau')d\tau' + \int_{\tau_+}^{\tau_-} x(\tau')d\tau' + \int_{\tau_-}^1 x(\tau')d\tau'$$
$$= x_m[2(\tau_- - \tau_+) - 1]$$

and using equation (3) and (4) we obtain $I(1) = x_m \frac{\varepsilon}{A}$.

For a generic $\tau > 0$ we have:

$$I(\tau) = nx_m\frac{\varepsilon}{A} + x_m\begin{cases} -\tau & \text{if } n \leq \tau < \tau_+ + n \\ \tau - 2\tau_+ & \text{if } \tau_+ + n \leq \tau < \tau_- + n \\ 2(\tau_- - \tau_+) - \tau & \text{if } \tau_- + n \leq \tau < n+1 \end{cases} \quad (11)$$

Figure 8:
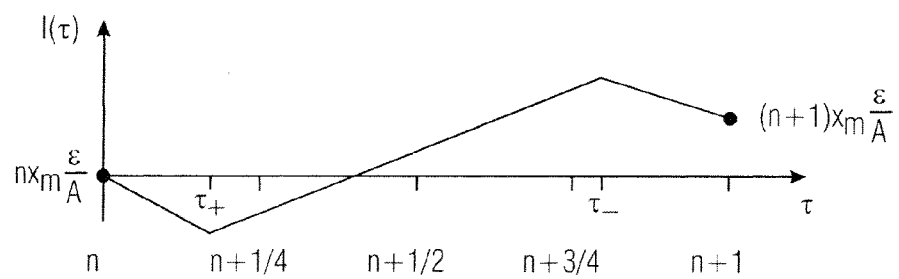
FIG. 8 is a graph of an integrated output signal of the sensor arrangement of FIG. 3.

Where, as stated before, $n = \text{int}(\tau)$. As it is apparent the function $I(\tau)$ is composed by two distinct contributions: one step function that increases its value every period of a quantity proportional to $\epsilon$ and a triangular function that superimposes onto the step function. An example for $I(\tau)$ is shown in FIG. 8.

It is interesting to note that if $I(\tau)$ is sampled at discrete times $\tau_i = i + \tau_0$ with $i = 0, 1, \ldots$, we obtain values that lie on a straight line. For different $\tau_0$ we have different lines but they are all parallels that have all the same angular coefficient m:

$$m = \epsilon x_m/A \quad (12)$$

Operatively, instead of measuring the computationally demanding $\Delta T$ we can use this result to obtain a measure of $\epsilon$ by monitoring the slope of a straight line obtained from the output integral, sampled at time interval equal to the period $T_0$ of the triangular bias. It is worth noticing that the slope computed in this way is equivalent to the average $\langle x \rangle$ taken over any time interval equal to an entire multiple of the period $T_0$. For this reason the computation of m can be realized through a conventional averaging system both digitally and analogically, for instance with a low-pass filter whose characteristic time constant is considerably greater than the period $T_0$.

Figure 9:
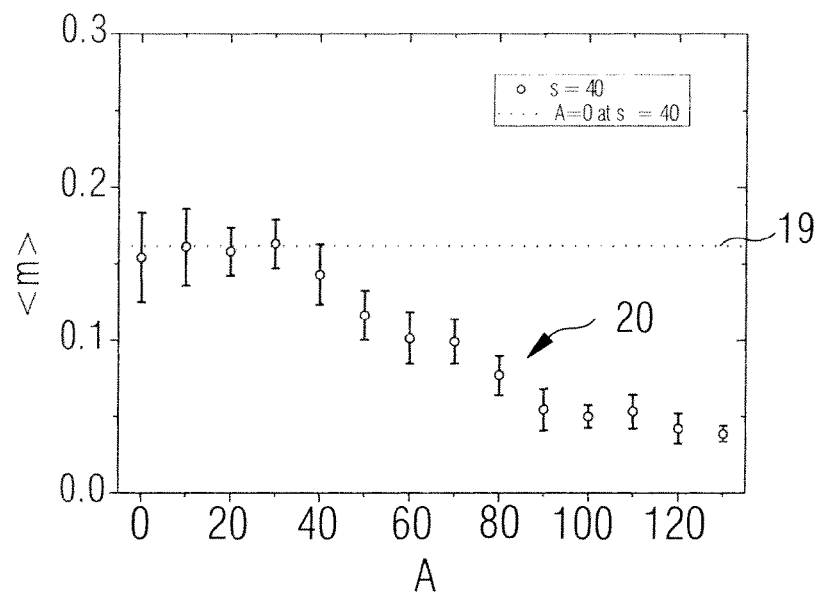
FIG. 9 is a diagram illustrating the dependency of a slope of the integrated signal of FIG. 8 from the amplitude of a bias signal.

It remains to be analyzed what is the optimal amplitude A of the auxiliary bias signal b(t). FIG. 9 shows the behavior of the slope m versus the bias signal amplitude A for fixed noise standard deviation s and bias frequency $\nu_0 = 1 = T_0$.

A horizontal line 19 represents the theoretical prediction for A=0 obtained by computing the slope m with equation (10), where $\tau_+$ and $T_-$ are estimated here in the limit where the threshold crossing mechanism is activated by the sole noise. In this limit, $\tau_+$ can be estimated as the mean first passage time of the stochastic process $\xi(t)$, i.e. the average time that $\xi(t)$ takes to assume the value $\xi(t) = b$ provided that $\xi(0) = b$. Analogously for $\tau_-$. In the other limit (large A) the behavior of m can be easily reproduced by equation (12) resulting in the dotted curve 20 in FIG. 9. In conclusion, as it is apparent from FIG. 9, provided that threshold is low enough in order that the crossings can be induced by the sole noise, the best choice for the bias signal amplitude is A=0, i.e. no bias signal.

Figure 10:
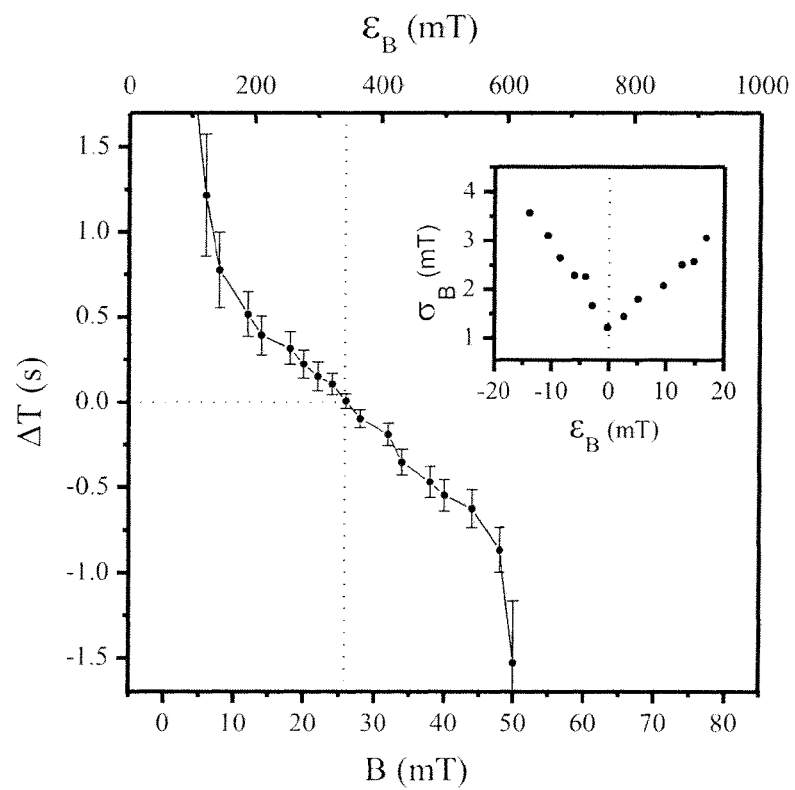
FIG. 10 is a diagram depicting the dependency of the shift of residence times on the strength of an external magnetic field.

The sensitivity of the sensor 7 can be estimated using FIG. 10. In FIG. 10 the shift of the residence times $\Delta T$ is plotted against the strength of an external magnetic field.

FIG. 10 further shows how the standard deviation varies with $\epsilon_B$, the offset from the actual value of the external magnetic field.

From FIG. 10, it can be recognized that a linear dependence between the magnetic field amplitude B and $\Delta T$ exits for a small deviation $\epsilon_B$. A linear fit with $B(\Delta T) = B_0 + \beta \Delta T$ between B=−14 mT and B=18 mT results in $B_0 = (25.89 \pm 0.25) \cdot 10^{-3}$ T and $\beta = (-27.00 \pm 0.69) \cdot 10^{-3}$ T/s.

The sensitivity of the magnetic sensor 7 can be estimated by observing that the magnetic field measurement is here transformed into a time measurement. To be more precise, apart from the statistical error on the measurement of $\Delta T$ that can be estimated and treated with averaging procedures, the limit sensitivity is given by the precision of the measurement of the switch time, namely the time it takes for the system to switch from one state to the other.

The smallest measurable switch time for this device is limited by two main error sources: 1) the external RC time of a low pass filter connected with the voltage signal readout electronics. 2) the intrinsic transition time. While error source 1) can be adjusted by proper design, error source 2) is fixed by the physics of the device itself, in particular by the time an electron with a Fermi velocity takes to traverse the forking region 15. This time is further minimized if the dimensions of the forking region 15 are smaller than the mean free path of the electrons within the forking region 15.

For a forking region 15 of about 100 nm length, a transit time in the order of 1 ps can be estimated, which in turn limits the sensitivity to $\beta \cdot 10^{-12} \approx 10^{-13}$T, a value that is orders of magnitude better than flux-gates, magnetoinductive, regular GMR and comparable to optical magnetometers, SQUIDs and SQUID based devices.

In conclusion, the Y-branch nonlinear magnetic field sensor 7 (Y-MAG) can be usefully employed to measure DC (or low frequency) magnetic signal much smaller than the internal noise of the device itself thanks to the nonlinear feature of its dynamics. Moreover, the operating principle is general enough that its application can be extended to the measurement of signals others than the pure magnetic, provided that the coupling with the system dynamics is capable to alter its symmetry.

Therefore, the sensor 7 described herein is able to detect very small magnetic and electrical fields with high local resolution. The local resolution is limited by the local extension forking region 15. Magnetic fields in the range below $10^{-10}$ T can be detected.

The sensor 7 can be used in the field of sensor technology and electronics. Compared to other sensors, the sensor 7 can be integrated into semiconductor devices. In principle, a version compatible with CMOS is also possible. The sensor 7 may also be used as a read-out sensor for information stored magnetically, for example in a reading head, or may be used as sensor in NMR devices or in the biomedical field.

A prototype of the sensor 7 was tested at low temperatures (20K). First tests as electrical sensor at room temperature had positive results.

Figure 11:
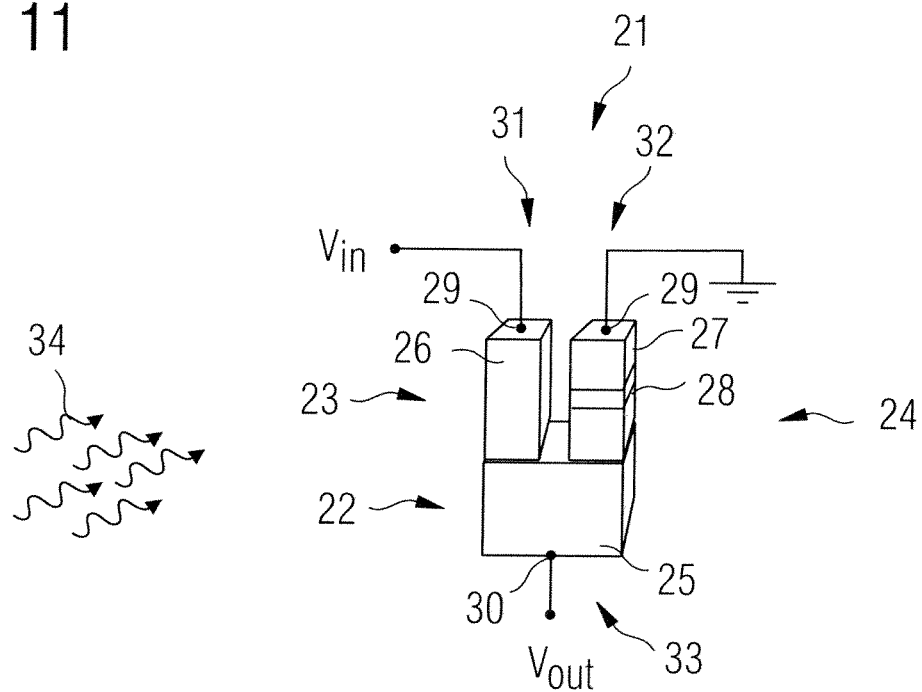
FIG. 11 shows another sensor arrangement for measuring electromagnetic quantities.

FIG. 11 shows another example in form of a sensor 21 that can be used as sensor for weak electromagnetic fields or as a detector for single photons.

The sensor 21 comprises a three-terminal-junction built up by three semiconductor structures 22, 23 and 24. In the example shown in FIG. 11, the semiconductor structure 22 is a substrate 25. The other two semiconductor structures 23 and 24 are branches 26 and 27 that consist of stacks of semiconductor layers deposited on the substrate 25. Branch 27 further comprises a bistable switching zone 28. An input voltage $V_{in}$ is applied to a contact pad 29 disposed on top of the branch 26. A further contact pad 29 disposed on top of the branch 27 is grounded. A contact pad 30 at the bottom of the substrate 25 is used for measuring an output voltage $V_{out}$.

Thus, the branch 26 has the function of the source 31, whereas the branch 27 has the function of the drain 32 and the substrate 25 the function of the gate 33. The input voltage $V_{in}$ is used to drive the switching zone 28 close to the bistable transition. If the conductance in any one of the semiconductor structures 22 to 24 is changed by exposing any one of the semiconductor structures 22 to 24 to a static or dynamic electromagnet field 34, the switching zone 28 flips into the other state of conductance.

It should be noted that the dynamic or static field 34 may be any static or dynamic electromagnetic field including the electromagnetic field associated with at least one photon.

The change of conductance of the switching zone 28 results in change of the current through the semiconductor structures 22 to 24 that can, for instance, be detected by measuring the voltage $V_{out}$ at the contact pad 30 disposed on the bottom of the substrate 25. Only very small changes of the conductance in any of the semiconductor structures 22 to 24 are required to trigger the bistable switching of the switching zone 28.

Figure 12:
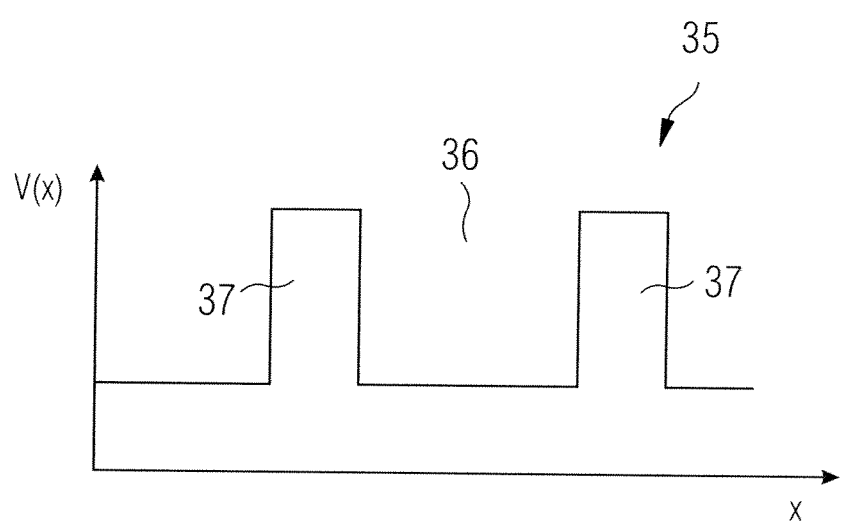
FIG. 12 illustrates the structure of the potential of a resonant tunneling structure.

The switching zone 28 can be formed by a resonant tunneling structure 35 as depicted in FIG. 12. In such a resonant tunneling structure 35 a potential well 36 is formed that is confined between two barriers 37. The resonant tunneling structure 35 allows the transmission of charge carriers at certain energy levels in which a multiple of half the wavelength of the charge carriers equals the distance between the barriers 37. It should be noted that the electron wavefunction in the lattice generally has a wavelength well above 10 nm so that the electron must be at relatively high energy level above the Fermi level for being able to pass through the tunneling structure 35.

Figure 13:
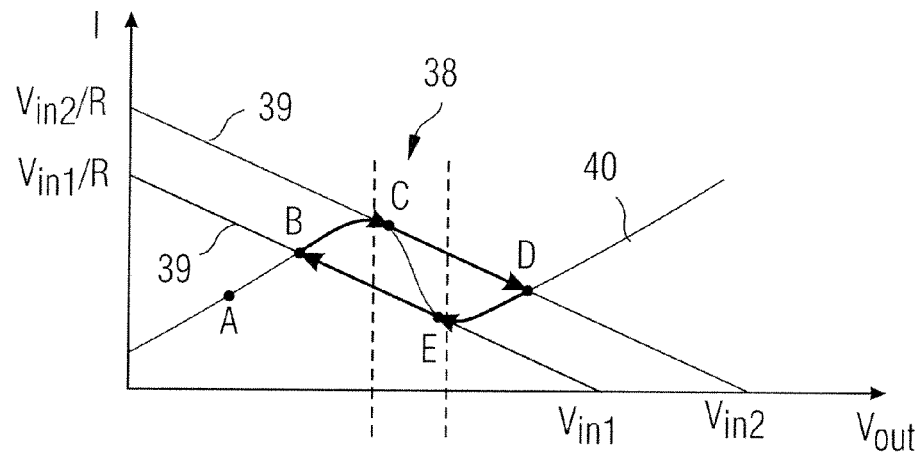
FIG. 13 shows a current-voltage-characteristic with a negative resistance region.

Due to the enhanced transmission of the electrons through the resonant tunneling structure 35 at higher energies of the electrons, a current-voltage-characteristic 40 of the resonant tunneling structure 35 comprises a intermediate region 38 of negative differential resistance (=NDR) as shown in FIG. 13. In front of the region 38 of NDR and behind the region 38 of NDR the current increases with increasing voltage. Within the region 38 of NDR, however, the current decreases with increasing voltage.

The region 38 of NDR causes bistable switching if the switching zone is connected in series with a resistance. In the example shown in FIG. 11, the resistance is provided by the branch 26 and the substrate 25. If the resistance and the input voltage $V_{in}$ is chosen such that a load line 39 intersects the region 38 of NDR, the switching zone 28 shows a bistable behavior. If the input voltage $V_{in}$ assumes values below $V_{in1}$, the current I from the source 31 to the drain 32 may adjust to a working point A on the current-voltage-characteristic 40 of the switching zone 28. If the input voltage is set to $V_{in1}$, the working point moves to B on the current-voltage characteristic 40. If the $V_{in}$ is further increased to $V_{in2}$, the working point moves to C and finally jumps to D. If the input voltage $V_{in}$ is decreased again from $V_{in2}$ to $V_{in1}$ the working point first moves from D to E and then jumps back to B.

Figure 14:
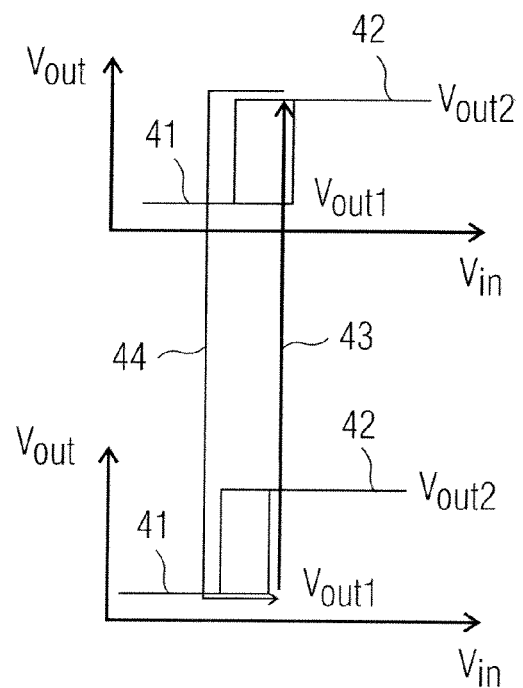
FIG. 14 illustrates the bistable switching behavior of the sensor arrangement of FIG. 11.

If the input voltage $V_{in}$ and the resistance are adjusted such that the load lines 39 intersect the region 38 of negative differential resistance, the sensor 21 has at least two stable states resulting in a bistable switching behavior depicted in FIG. 14. The stable states are represented by a lower state 41 of the output voltage $V_{out}$ and a higher state 42 of the output voltage $V_{out}$.

$V_{in}$ is typically set to a value in the order of 1 V. Then the bistable switching zone can be in the lower state 41. If a small change of $V_{in}$ occurs, this change of $V_{in}$ triggers a large jump 43 from the lower state 41 to the higher state 42 with higher values of the voltage $V_{out}$. This change is due to a change of the conductance in the sensor 21.

To make the sensor 21 efficient, it is essential that the static or dynamic field 34 causes a conductance change close to the bistable switching zone 28. The change in conductance implies a change in resistance R. Thus, the slope of the load lines 39 is changed and a switching operation of the sensor 21 can be triggered. By this mechanism, the field 34 is able to trigger the bistable switching process.

The sensor 21 in its initial state is biased to a stable state close to the threshold. Then the sensor 21 is exposed to the field 34 as described above. This leads to a change of the threshold voltage in such a way that the output voltage $V_{out}$ switches to the other stable state 42 by the jump 43. The sensor 21 resides in the other stable 42 state until the sensor 21 is set back to its initial state by a dynamic voltage sweep 44 of $V_{in}$. Then the process starts again. The basic mechanism is related to the fact that the field 34 leads to a threshold shift, so that the jump 43 can occur. If now the voltage cycling is controlled dynamically, there are many cases for fast cycling within a certain integration time, for which the sensor 21 is extremely close to the threshold and the field 34 triggers the switching.

It is also possible to choose the working point such that the detection process starts in the higher state 42. The presence of the field 34 then causes a jump in the output voltage from the higher state 42 to the lower state 41.

The bistable voltage change at $V_{out}$ can reach values of several 100 mV. The sensor 21, therefore, works as a very efficient amplifier. If a detection method of the type described in conjunction with the nanojunction 1 is used for the sensor 21 as many as possible switching events caused by the field 34 should be collected. It is therefore useful to drive $V_{in}$ dynamically with a high frequency in such a way that the system is as often as possible in either the lower state 41 or in the higher state 42. The limiting factor of switching events is given only by the dynamics of the sensor 21. For switching zones 28 whose dimensions in the direction of the current are smaller than the ballistic mean free path of the charge carriers, switching frequencies can reach values up to the THz range. Typical dimensions of these switching zones are up to a few 100 nm at room temperature. If the accuracy of the measurement is less important, also switching zones 28, whose dimensions in the direction of the current are greater than the ballistic mean free path, can be considered.

In practice, the mean value of the bistable output voltage $V_{out}$, which can be easily integrated by a voltmeter, is sufficient due to the amplifier functionality of the sensor 21 in the bistable, dynamic regime. This is a much easier detection strategy compared to residence time based analysis.

It is essential that the sensor 21 comprises a conductor which provides bistable switching with fast dynamics. In particular, as soon as the output voltage $V_{out}$ is triggered over the threshold, at which switching to the other state sets in, the sensor 21 drives itself fast—compared to the integration time—to the stable state. This can occur, if at least one of the semiconductor structures 22 to 24 shown in FIG. 11 has a negative differential resistance. Such a device is, for instance, a Resonant Tunneling Diode (=RTD).

Figure 15:
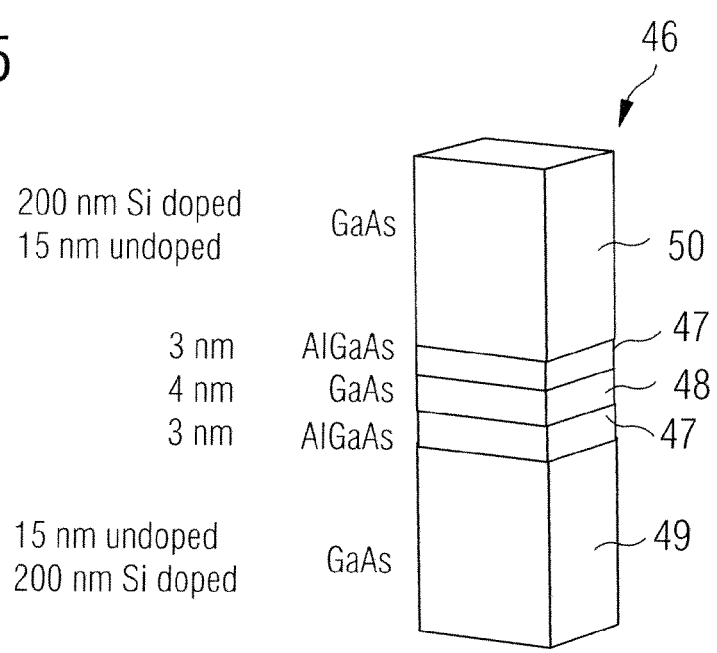
FIG. 15 shows the layer sequence of a resonant tunneling diode used for the sensor arrangement of FIG. 11.
Figure 16:
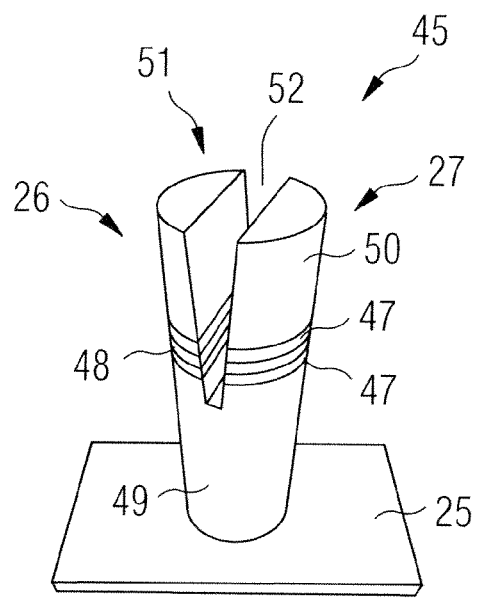
FIG. 16 is a view on a semiconductor structure for the sensor arrangement of FIG. 11.

In FIGS. 15 and 16 a three-terminal nanojunctions 45 is shown which has been produced by lateral etching of a planar RTD structure 46 made from GaAs/AlGaAs. The nanojunction 45 can be used for the sensor 21.

The basic sequence of layers of the RTD structure 46 is depicted in FIG. 15. The RTD structure 46 comprises two barrier layers 47 of AlGaAs embedding a thin central layer 48 made from GaAs. The thicknesses of the central layer 48 and barrier layers 47 typically are below 10 nm. Above and below the barrier layers extend a base layer 49 and a cover layer 50, both made from GaAs. In the region next to the barrier layers 48, the base layer 49 and the cover layer 50 remain undoped. Otherwise the base layer 49 and the cover layer 50 are n-doped, for instance with Si.

By structuring a mask in a shape of two half disks on the RTD structure 46 and by dry etching, for instance by a plasma etching process, a mesa 51 was defined, which consists of the two branches 26 and 27, separated by a narrow trench 52. At least one of the branches 26 and 27 includes the RTD structure 46 comprising the resonant tunneling structure 35.

The sensors 7 and 21 can be arranged for the detection of electromagnetic fields or photons with a high local and time resolution:

If the sensor 21 is used for the detection of magnetic fields, the shift of the threshold may, for instance, be caused by magnetic deflection as described in conjunction with the nanojunction 1. This mechanism is enhanced for voltages in the order of 1 V and further enhanced by the roughness of surfaces of the semiconductor structures 22 to 24.

Figure 17:
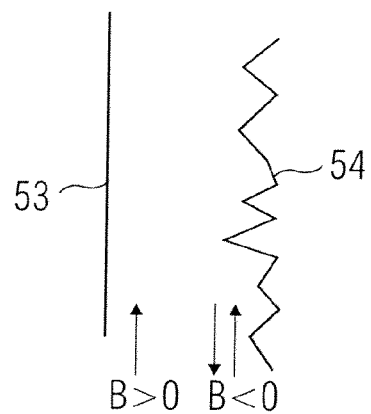
FIG. 17 illustrates the effect of an external magnetic field on the conductance within a branch of the sensor arrangement of FIG. 11.

FIG. 17 illustrates the effect of sidewalls 53 and 54 with various roughnesses. In FIG. 17, sidewall 53 is relatively smooth, whereas the roughness of the opposite sidewall 54 is enhanced. In the so-called nonlinear transport regime, the differently rough sidewalls 53 and 54, for instance of the branches 26 and 27, lead to different scattering rates of the charge carriers for different magnetic fields. Different scattering rates for different magnetic fields, cause different conductance values and thus different thresholds for the bistable switching. This can easily be detected by the detection method described above. The asymmetries between adjacent sidewalls can be realized by etching the trench 52. For example, dry etching causes rough side walls in contrast to wet etching which generates smooth side walls.

If the sensor 21 is used as a detector for photons or a radiation detector, photons down to the quantum level of single photons can become absorbed in the semiconductor structures 22 to 24 and thus create electron-hole pairs which modulate the conductance. This in turn changes the threshold. The threshold shift is then again detected by the above described detection scheme. A particular high sensitivity is reached by light focused from the top onto the central trench 52 so that charge carriers can be excited close to the bistable conductor. For detection of light with wavelengths larger than 0.9 μm low gap semiconductors should be used to provide efficient absorption like, GaInNAs, GaAs, InAs and similar heterostructures.

Figure 18:
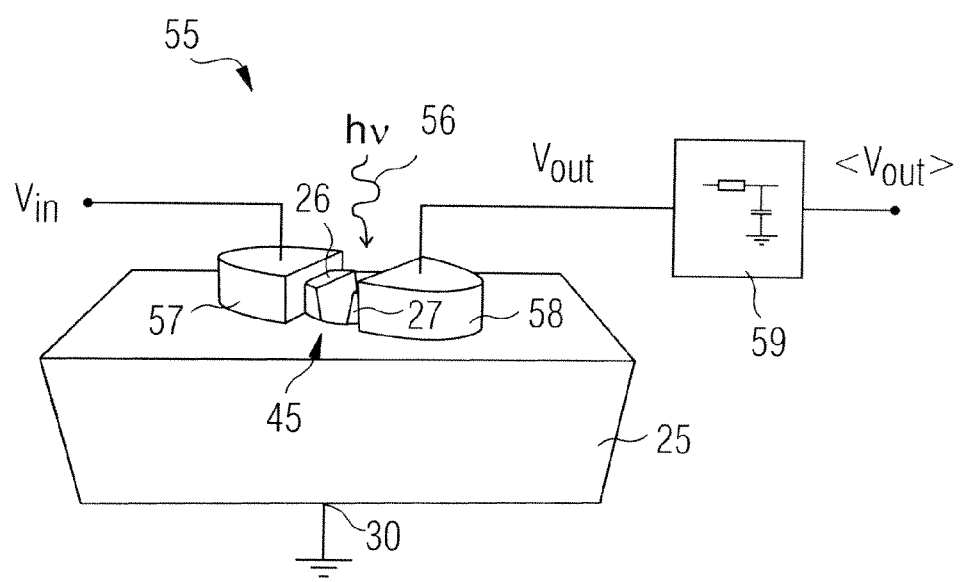
FIG. 18 shows a further example of the sensor of FIG. 11.

FIG. 18 shows a sensor 55 based on the nanojunction 45 as used in an experiment for detecting fluxes of photons 56. The photons 56 arrive at the trench 52 of the nanojunction 45 and are absorbed by both branches 26 and 27. The input voltage $V_{in}$ is applied to the branch 26 of the sensor 55 via a lateral contact pad 57. Thus in the arrangement shown in FIG. 18, the resonant tunneling structure 35 of the branch 26 is used as an active switching zone 28. The contact pad 30 at the bottom of the substrate 25 is grounded, whereas the output voltage $V_{out}$ is measured on a lateral contact pad 58 disposed next to the branch 27. The output voltage $V_{out}$ is further processed by a low pass filter 59, which is averaging the output voltage $V_{out}$ and produces a mean output voltage $<V_{out}>$.

The input voltage $V_{in}$ was set to 1.6 Volt and modulated by an amplitude of 20 mV at a frequency of 2 kHz. Using a voltmeter, the mean output voltage $<V_{out}>$ was measured, during 1 sec, corresponding to 2000 switching cycles. The averaged output voltages $<V_{out}>$ were sampled with a frequency of 2 kHz and the distribution of the values of the mean output voltage $<V_{out}>$ was determined.

Figure 19:
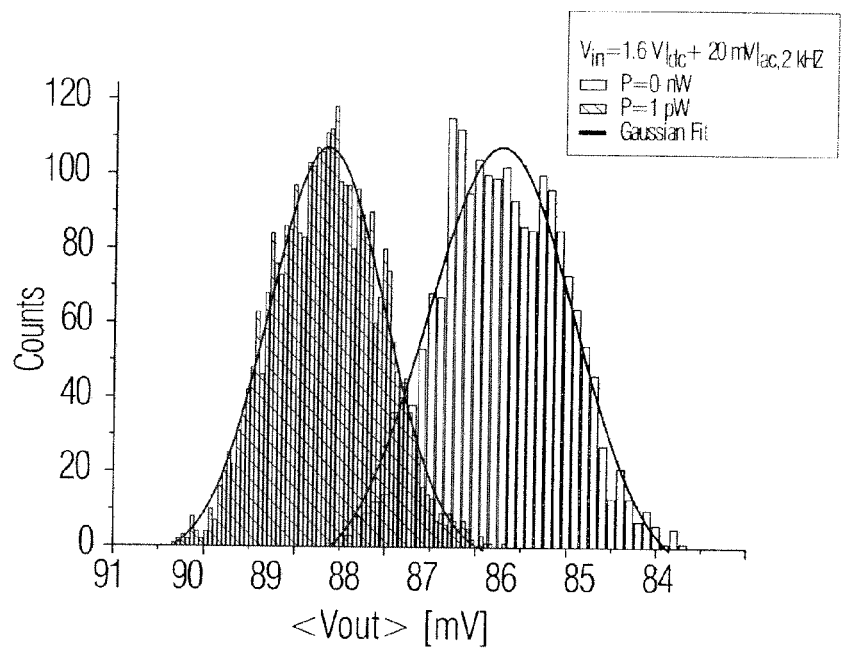
FIG. 19 is diagram containing the distribution of output voltages generated by the sensor arrangement of FIG. 18.

The result of the experiment is shown in FIG. 19. From FIG. 19 the shift of the distribution due to the incident photon flux of 1 pW can be recognized. If the sensor 55 is operated with a frequency in the range of 6 GHz and if a counting rate of 3 MHz corresponding to 2000 switching cycles is used, a single photon with a wavelength of 600 nm can be detected in principle.

Figure 20:
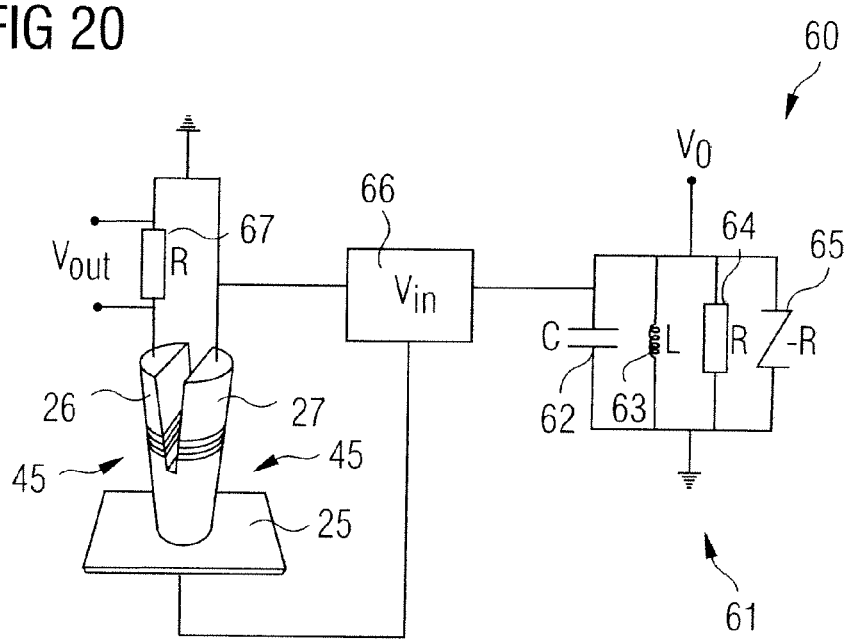
FIG. 20 is a circuit diagram for a sensor with enhanced accuracy.

FIG. 20 shows a sensor 60 whose accuracy is enhanced by using an oscillator 61. By the oscillator 61 the bias signal $V_{in}$ of the sensor 60 is modulated. The oscillator circuit 61 comprises a capacitance 62, an inductance 63, a damping resistance 64 and a resonant tunneling diode 65, each connected in parallel. The resonant tunneling diode 65 comprises the same RTD structure 46 as the branch 26 of the nanojunction 45 and is used for canceling the damping by the damping resistance 64 within the region 38 of negative differential resistance. The signal generated by the oscillator circuit 60 is added to a DC component in an input voltage source 66. The input voltage source is connected to the substrate 25 and the grounded branch 27. The other branch 26 is connected in series with a measurement resistance 67. Over the measurement resistance 67 the output voltage $V_{out}$ is measured. The oscillator circuit within the sensor 60 can be used for increasing the modulation frequency of the input voltage $V_{in}$ resulting in an improved accuracy of the measurement under the condition of a given integration time.

If the sensor 7 or 21 is used for detecting electric fields or voltage differences, the voltage difference can be superimposed directly to an input terminal. Else, the principles are identical to the magnetic field detection scheme that the field changes the scattering rates.

The sensors 7 and 21 can also be used for measuring other quantities than electromagnetic quantities. If these quantities have some effect on electromagnetic quantities that can directly be measured by the sensor 7 or 21, the sensor 7 or 21 can be used for an indirect measurement of these other quantities.

Figure 21:
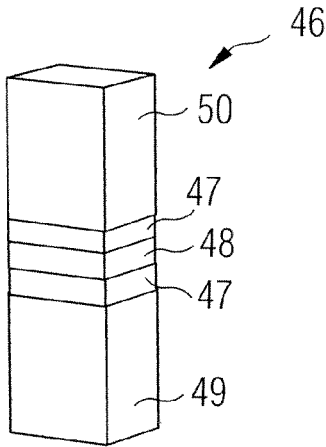
FIGS. 21 to 23 show resonant tunneling structures composed of various materials.
Figure 22:
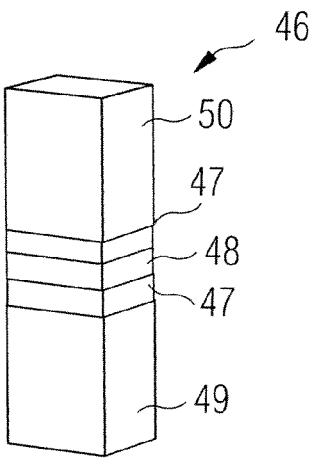
Figure 23:
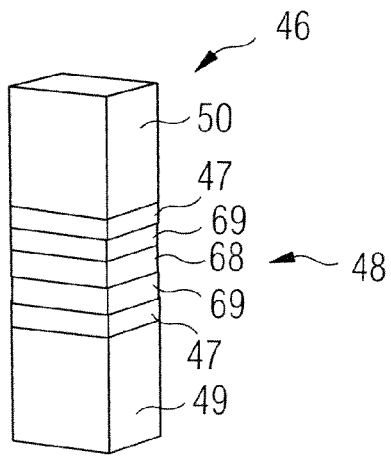

In FIGS. 21 to 23 various other examples of the RTD structure 46 are shown. For example, the RTD structure 46 of FIG. 21 is based on Sb. This structure is particularly suited for the detection of photons in the wavelength range between 1.8 μm and 4 μm. The central layer 48 is based on GaSb and typically comprises a thickness of 8 nm. The adjacent barrier layers 47 with a typical thickness of 2 nm are based on AlSb, whereas the base layer 49 and the cover layer 50 are based on InAs and comprise a thickness of 210 nm, wherein the region next to the barrier layers with a thickness of 10 nm remains undoped whereas the outer region with a thickness of 200 nm is doped with Si.

FIG. 22 shows a similar RTD structure 46, in which the central layer 48 of the RTD structure 46 shown in FIG. 21 is replaced by a central layer 48 based on InAs.

FIG. 23 shows a further example in which a InP substrate is used. The example of FIG. 23 further differs from the example shown in FIGS. 21 and 22 by a central layer 48 that is composed by a core layer 68 based on InAs with a thickness of 5 nm and two adjacent intermediate layers 69 based on InGaAs with a thickness of 2 nm. The barrier layers 47 are further based on AlAs. The base layer 49 and the cover layer 50 are based on InGaAs. The thickness and the doping of the base layer 49 and the cover layer 50 are the same as in the examples of the FIGS. 21 and 22.

The examples shown in FIGS. 21 to 23 are n-doped with Si. Other material system and doping materials for n-doping or p-doping may also be considered for the RTD structure 46.

It should be noted that, throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds or groups described in conjunction with a particular aspect, embodiment or example are to be understood to be applicable to any other aspect, embodiment or example described herein unless incompatible therewith.

While the present invention has been described with reference to specific examples, which are intended to be illustrative only and not to be limiting of the invention, it will be apparent to those of ordinary skill in the art that changes, additions or deletions may be made to the disclosed embodiments without departing from the spirit and scope of the invention.

What is claimed is:

1. A sensor for electromagnetic quantities comprising:
a bistable device whose residence times in the stable states depend on the electromagnetic quantity; and
an analyzer circuit arranged for generating a sensor output signal dependent on the residence times of the bistable device,
wherein the bistable device is a switching device comprising a switching zone, whose dimension in the direction of a current of charge carriers is smaller than the ballistic mean free path of the charge carriers within the switching zone.

2. The sensor according to claim 1, wherein the bistable device is connected to a bias signal generator, and that the bias signal supplied by the bias signal generator causes the bistable device to operate in a bistable mode.

3. The sensor according to claim 1, wherein the bias signal is oscillating and that the sensor output signal is integrated over a plurality of cycles by the analyzer circuit.

4. The sensor according to claim 1, wherein the switching device is a nanojunction comprising at least a source, a gate, and a drain.

5. The sensor according to claim 4, wherein the switching device is a Y-branch nanojunction and that the switching zone is a forking region of the Y-branch nanojunction.

6. The sensor according to claim 5, wherein the bias voltages are applied between a stem functioning as the source and a branch functioning as the gate and are further applied between the stem and the other branch functioning as the drain and that the output signal depends on the current flowing from the source to the drain.

7. The sensor according to claim 4, wherein the switching device comprises a switching zone having an intermediate current-voltage-characteristic with a region of negative differential resistance, wherein the switching zone is connected in series with a resistance and wherein load lines depending on the resistance and an voltage over the resistance and the switching zone are crossing the current-voltage-characteristic within the region of negative differential resistance.

8. The sensor according to claim 7, wherein the switching zone has a resonance tunneling structure comprising at least one potential well confined within two adjacent potential barriers.

9. The sensor according to claim 7, wherein the sensor comprises a layer sequence on a substrate and that the layer sequence is separated into two branches by a trench, wherein the switching zone is formed in at least one of the braches and wherein the trench extends through the switching zone.

10. The sensor according to claim 7, wherein the switching device interacts with a sensing arrangement, whose conductance depends on the strength of the electromagnetic quantity.

11. The sensor according to claim 10, wherein the electromagnetic quantity is a magnetic field and that the sensing arrangement is a variation of the roughness of surfaces of the sensor.

12. The sensor according to claim 10, wherein the electromagnetic quantity is a photon flux and that the sensing arrangement is formed by material suitable for the absorption of radiation.

13. The sensor according to claim 8, wherein the switching device is based on at least one component of the group containing phosphides, arsenides and anti-monides.

14. A method for measuring electromagnetic quantities comprising:
operating a bistable device, whose residence times in the stable states depend on the electromagnetic quantity, in a bistable operation mode; and
generating a sensor output signal dependent on the residence times of the bistable device by an analyzer circuit interacting with the bistable device,
wherein a switching device comprising a switching zone, whose dimension in the direction of a current of charge carriers is smaller than the ballistic mean free path of the charge carriers within the switching zone, is used as bistable device.

15. The method according to claim 14, wherein the bistable device is connected to a bias signal generator, and that the bias signal causes the bistable device to operate in a bistable mode.

16. The method according to claim 15, wherein the bias signal is oscillated and that the sensor output signal is integrated over a plurality of cycles.

* * * * *